US012585858B1

(12) United States Patent
Posser et al.

(10) Patent No.: US 12,585,858 B1
(45) Date of Patent: Mar. 24, 2026

(54) GRID CELL ROUTING CAPACITY ADJUSTMENT BASED ON PIN DENSITY

(71) Applicant: Cadence Design Systems, Inc., San Jose, CA (US)

(72) Inventors: Gracieli Posser, Austin, TX (US); Mateus Paiva Fogaça, Porto Alegre (BR); Mehmet Can Yildiz, Austin, TX (US); Charles Jay Alpert, Cedar Park, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 881 days.

(21) Appl. No.: 17/896,926

(22) Filed: Aug. 26, 2022

Related U.S. Application Data

(63) Continuation of application No. 17/893,401, filed on Aug. 23, 2022, now abandoned.

(51) Int. Cl.
*G06F 30/3947* (2020.01)
(52) U.S. Cl.
CPC ................................ *G06F 30/3947* (2020.01)

(58) Field of Classification Search
CPC .................................................... G06F 30/3947
USPC ......................................................... 716/129
See application file for complete search history.

(56) References Cited

U.S. PATENT DOCUMENTS

| | | | | |
|---|---|---|---|---|
| 10,885,257 | B1 * | 1/2021 | Posser | G06F 30/398 |
| 11,120,192 | B1 * | 9/2021 | Xiang | G06F 30/394 |
| 2013/0086544 | A1 * | 4/2013 | Alpert | G06F 30/394 |
| | | | | 716/129 |
| 2014/0189617 | A1 * | 7/2014 | Rashingkar | G06F 30/31 |
| | | | | 716/102 |
| 2018/0107778 | A1 * | 4/2018 | Muuss | G06F 30/394 |

* cited by examiner

*Primary Examiner* — Suchin Parihar
(74) *Attorney, Agent, or Firm* — Schwegman Lundberg & Woessner, P.A.

(57) ABSTRACT

Various embodiments provide for adjusting routing capacity of a grid cell based on pin density, which can be used in global routing of a circuit design and may be part of electronic design automation (EDA). More particularly, various embodiments model routing capacity of grid cells of a circuit design based on pin density.

20 Claims, 10 Drawing Sheets

200

200

202 — ACCESS CIRCUIT DATA DESCRIBING
LAYER(S), PIN(S), AND WIRE INFORMATION OF CIRCUIT DESIGN

204 — DETERMINE LAYER PIN COUNT VALUE(S) FOR LAYER(S)

206 — DETERMINE CLASSIFICATION(S) FOR LAYER(S)

208 — DETERMINE GRID CELL PIN COUNT VALUES FOR GRID CELLS OF
LAYER(S)

210 — ADJUST ROUTING CAPACITY OF SELECT GRID CELL BASED ON
CLASSIFICATION(S) AND GRID CELL PIN COUNT VALUES

300
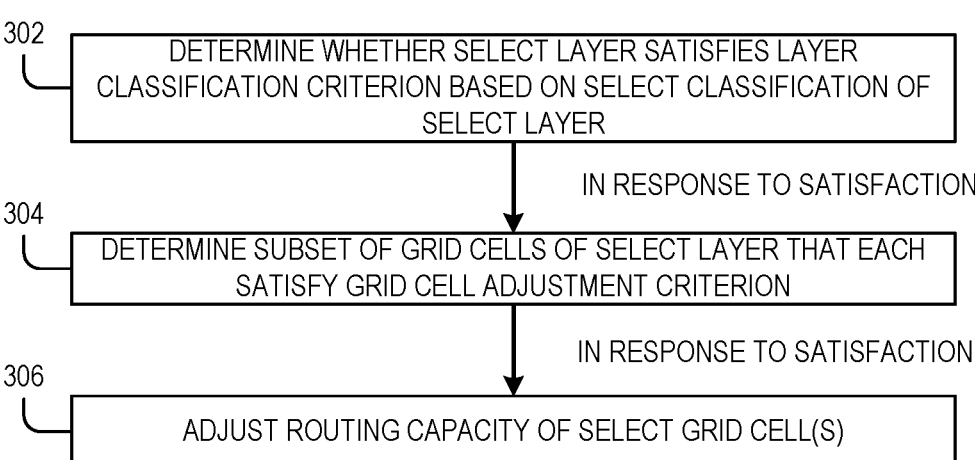
302  DETERMINE WHETHER SELECT LAYER SATISFIES LAYER
     CLASSIFICATION CRITERION BASED ON SELECT CLASSIFICATION OF
     SELECT LAYER
                                            IN RESPONSE TO SATISFACTION
304  DETERMINE SUBSET OF GRID CELLS OF SELECT LAYER THAT EACH
     SATISFY GRID CELL ADJUSTMENT CRITERION
                                            IN RESPONSE TO SATISFACTION
306  ADJUST ROUTING CAPACITY OF SELECT GRID CELL(S)
*FIG. 3*

400

402   INPUT: LIST OF LAYERS $L$ AND LIST OF PINS $P$

404   LET $p_i$ BE THE I-TH PIN IN $P$

406   LET $layer(p_i)$ BE THE LAYER OF PIN $p_i$

408   LET $NP_l$ BE THE NUMBER OF PINS IN THE L-TH LAYER IN $L$

410   LET $|P|$ BE THE NUMBER OF PINS IN $P$

412   $i \leftarrow 1$

414   $l \leftarrow layer(p_i)$

416   $NP_l \leftarrow NP_l + 1$

418   $i \leftarrow i + 1$

420   $i \leq |P|$

YES

NO

422   FINISH

500

502 INPUT: LIST OF LAYERS $L$, NUMBER OF PINS $|P|$ AND NUMBER OF PINS PER LAYER $NP$

504 LET $T_1$ AND $T_2$ BE THE RATIOS TO BE CONSIDER PIN AND PIN ACCESS LAYERS, RESPECTIVELY

506 LET $\ell_i$ BE THE I-TH LAYER IN $L$

508 LET $C_i$ BE THE CLASSIFICATION OF THE I-TH LAYER IN $L$

510 LET $NP_i$ BE THE NUMBER OF PINS IN THE I-TH LAYER IN $L$

512 $i \leftarrow 1$

514 $NP_i = 0$

YES
520 $C_i \leftarrow TOIGNORE$
$i \leftarrow i + 1$

530 $i \leq |L|$ — NO

NO

516 $NP_i \geq T_1 \times |P|$

YES
522 $C_i \leftarrow PINLAYER$
$i \leftarrow i + 1$

532 $i \leq |L|$ — NO

NO

518 $C_{i-1} = PinLayer$ OR $C_{i-2} = PinLayer$ OR $\frac{W_i}{W_{i-1}} < T_2$

YES
524 $C_i \leftarrow PALAYER$
$i \leftarrow i + 1$

534 $i \leq |L|$ — NO

NO
526 $C_i \leftarrow OTHER$
$i \leftarrow i + 1$

536 $i \leq |L|$ — NO

YES

540 FINISH

INPUT: LIST OF PINS $P$ AND GRID OF GCELLS $G$

604

LET $P_i$ BE THE I-TH PIN IN $P$

606

LET $|P|$ BE THE NUMBER OF PINS

608

LET $X(p_i)$ AND $Y(p_i)$ BE X AND Y GRID LOCATIONS OF PIN $p_i$

610

LET $NG_{x,y}$ BE THE NUMBER OF PINS OF THE GCELL IN POSITION $(x, y)$

612

$i \leftarrow 1$

614

$x_i \leftarrow X(p_i)$
$y_i \leftarrow Y(p_i)$

616

$NG_{x,y} \leftarrow NG_{x,y} + 1$

618

$i \leftarrow i + 1$

620

$i \leq |P|$

YES

NO

622

FINISH

700

702

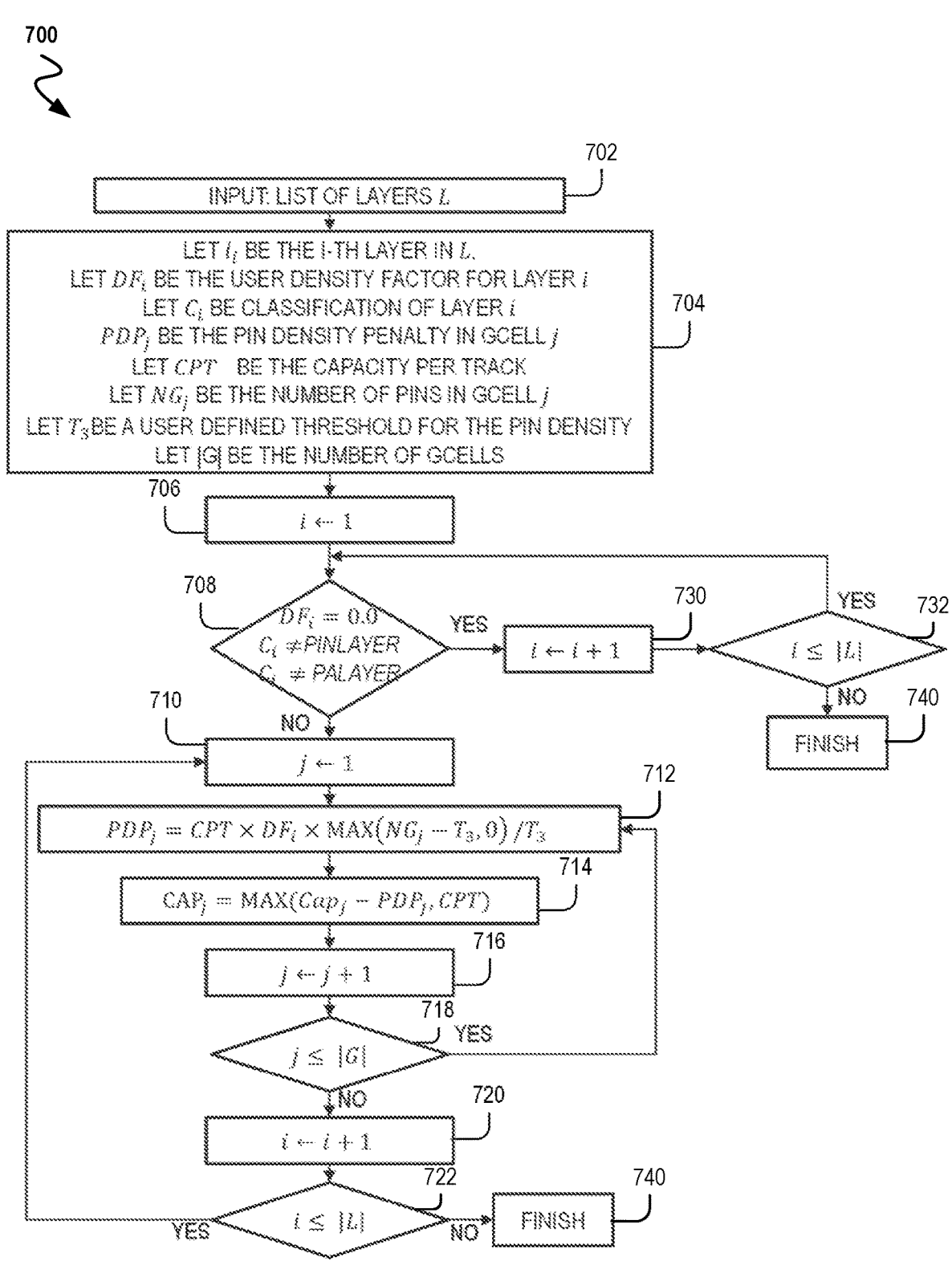

INPUT: LIST OF LAYERS $L$

704

LET $l_i$ BE THE $i$-TH LAYER IN $L$,
LET $DF_i$ BE THE USER DENSITY FACTOR FOR LAYER $i$
LET $C_i$ BE CLASSIFICATION OF LAYER $i$
$PDP_j$ BE THE PIN DENSITY PENALTY IN GCELL $j$
LET $CPT$   BE THE CAPACITY PER TRACK
LET $NG_j$ BE THE NUMBER OF PINS IN GCELL $j$
LET $T_3$ BE A USER DEFINED THRESHOLD FOR THE PIN DENSITY
LET $|G|$ BE THE NUMBER OF GCELLS

706

$i \leftarrow 1$

708

$DF_i = 0.0$
$C_i \neq PINLAYER$
$C_i \neq PALAYER$

YES

730

$i \leftarrow i + 1$

YES   732

$i \leq |L|$

NO   740

FINISH

NO

710

$j \leftarrow 1$

712

$$PDP_j = CPT \times DF_i \times MAX(NG_j - T_3, 0)/T_3$$

714

$$CAP_j = MAX(Cap_j - PDP_j, CPT)$$

716

$j \leftarrow j + 1$

718

$j \leq |G|$   YES

NO

720

$i \leftarrow i + 1$

722

YES   $i \leq |L|$   NO

740

FINISH

*FIG. 7*

800
802
802
804
806
802
806
802
806
804
CAP = 4
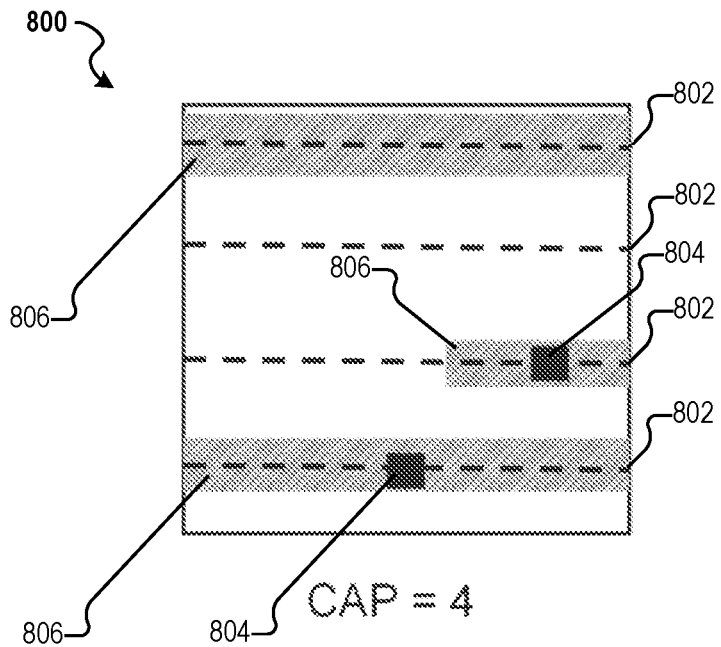
810
816
814
812
814
812
814
816
814
812
816
812
CAP = 3
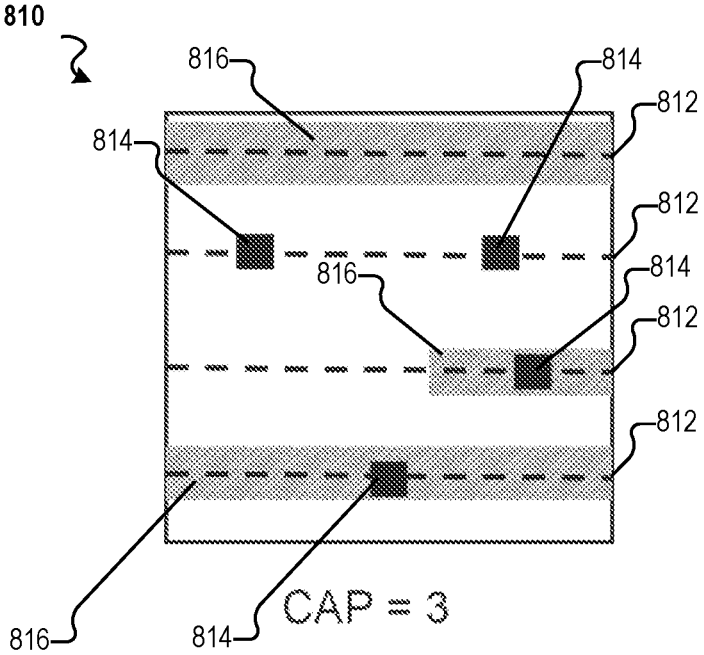
*FIG. 8*

900

SOFTWARE ARCHITECTURE 902

APPLICATIONS 910

ROUTING CAPACITY
ADJUSTMENT BASED ON
PIN DENSITY 942

FRAMEWORKS 908

LIBRARIES 906

| SYSTEM 930 | API 932 | OTHER 934 |

OPERATING SYSTEM 904

| KERNEL 920 | SERVICES 922 | DRIVERS 924 |

API CALLS 912

MESSAGES 914

MACHINE 1000

| PROCESSORS 1010 | MEMORY 1030 | I/O COMPONENTS 1050 |

GRID CELL ROUTING CAPACITY ADJUSTMENT BASED ON PIN DENSITY

CLAIM OF PRIORITY

This application is a continuation of and claims the benefit of priority under 35 U.S.C. § 120 to U.S. patent application Ser. No. 17/893,401, filed on Aug. 23, 2022, which is incorporated by reference herein in its entirety

TECHNICAL FIELD

Embodiments described herein relate to circuit design and, more particularly, to systems, methods, devices, and instructions for adjusting routing capacity of a grid cell based on pin density, which may be part of electronic design automation (EDA).

BACKGROUND

Electronic design automation (EDA) software systems commonly perform routing of networks of circuit designs, such as clock networks (hereafter, clock nets). Usually, a network of a circuit design comprises a set of pins, and a routing process can route a path to connect the network. Net routing can be performed in two phases, where the first phase involves routing guides (e.g., global routing paths) that attempt to generate timing-aware/timing-based global routing of nets, and the second phase involves detailed routing of nets with specific wires (e.g., metal traces) based on the routing guides, while attempting to resolve/avoid one or more design rule violations.

BRIEF DESCRIPTION OF THE DRAWINGS

Various ones of the appended drawings merely illustrate various embodiments of the present disclosure and should not be considered as limiting its scope.

FIGS. 2 through 7 are flowcharts illustrating example methods for adjusting routing capacity of one or more grid cells of one or more layers of a circuit design based on pin density, according to some embodiments.

FIG. 8 is a diagram illustrating example grid cells that illustrate a difference in routing capacity based on pin density within the grid cell, according to some embodiments.

DETAILED DESCRIPTION

Figure 1:
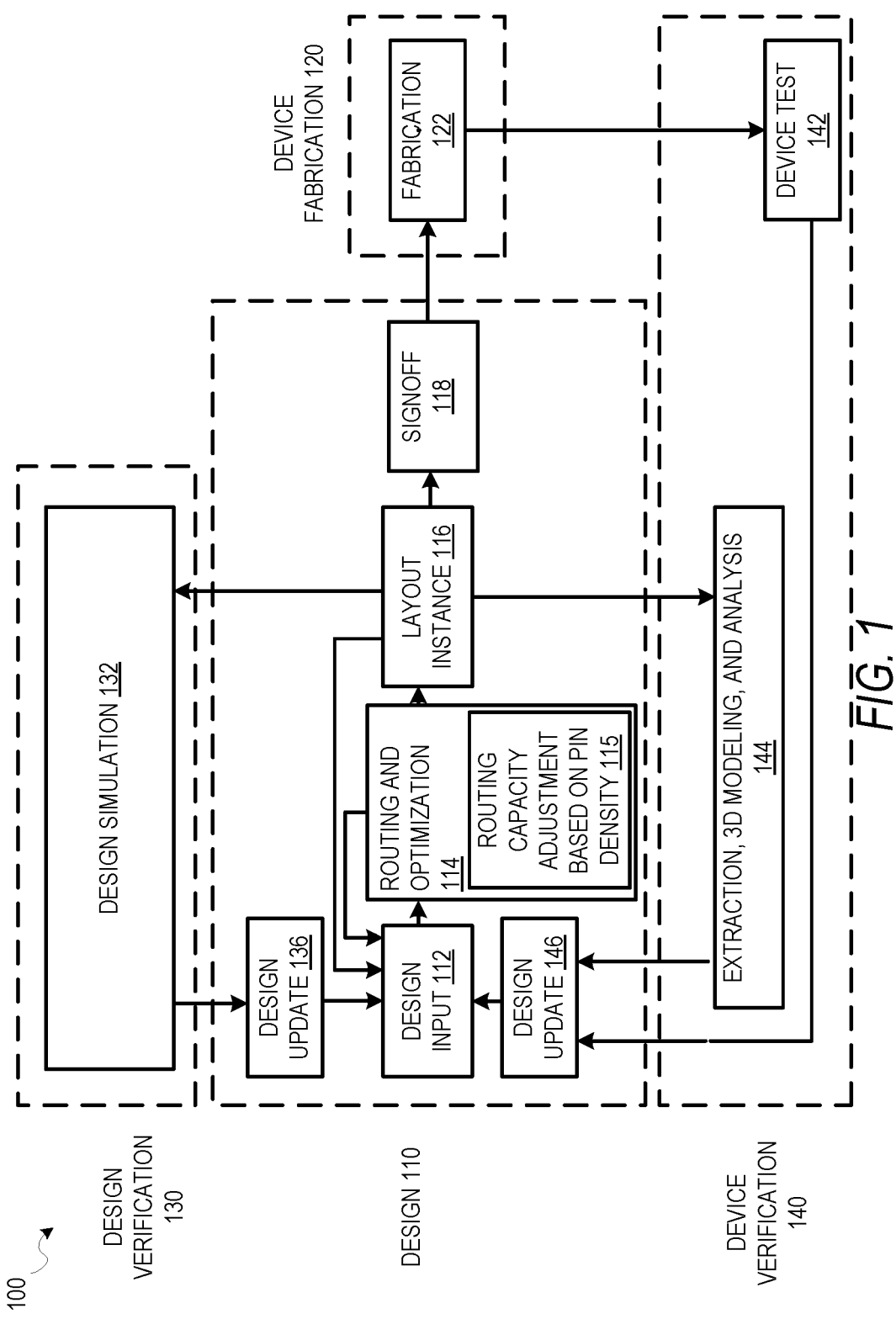
FIG. 1 is a diagram illustrating an example design process flow for adjusting routing capacity of a grid cell based on pin density, according to some embodiments.

Traditionally, global routing comprises two-dimensional (2D) net routing, layer assignment of wires of nets, or track assignment of wires of nets. Resolving congestion and major design rule constraints (DRCs) during global routing can facilitate detailed routing of nets. Conventional global routing can route nets of a circuit design by dividing the circuit design (e.g., each layer of the circuit design) into a grid of cells (also referred to as "global routing cells," "grid cell," or "g-cells"), where each grid cell comprises a set number of resources (e.g., horizontal and vertical resources, such as tracks) for routing a net, referred to as capacity, and a number of resources that are currently being used or demanded by global routing to route a network, referred to as demand. A cell can be square or rectangle in shape. Overflow for a given grid cell is usually determined by subtracting the demand for the given grid from the capacity of the given grid, where an overflow comprising a negative number indicates more demand for routing resources than available capacity of resources. A grid cell can be considered congested if the number of resources of the grid cell is less than what is needed to route a network through the grid cell, which is indicated by a negative number for overflow.

Based on the grid of cells, global routing can route a net of the circuit design by assigning the net to a set of specific grid cells and a set of specific layers (metal layer) of the circuit design. Generally, using grid cells permits global routing to speed up the process of finding the net routing solutions by analyzing routing congestion based on grid cell congestion and by reducing the number of pathways to consider for net routing.

In a circuit design, pin access in a circuit design can be a critical problem on new technology nodes. Generally, accessing a pin in a layer where the pin is located can take routing resources, where upper layers are usually used to access the pins, and this causes routing congestion on the layer. With respect to pin density, during circuit design routing, pin shapes in a grid cell can be disposed in the same layer of circuit design that circuit design routing (e.g., global routing) is permitted to use for routing, and this can cause congestion in grid cells.

Various embodiments provide for adjusting routing capacity of a grid cell of a layer of a circuit design based on pin density, which can be used in global routing of a circuit design and may be part of electronic design automation (EDA). More particularly, various embodiments model routing capacity of grid cells of a circuit design based on pin density.

According to some embodiments, one or more layers of a circuit design are determined (e.g., recognized or identified) as pin access layers. Some embodiments model pin density within a circuit design based on one or more layers (of the circuit design) determined to be pin access layers (or identified by a user), where the pin density can be used to determine (e.g., adjust) routing capacity of one or more layer portions (e.g., grid cells) of the circuit design. Eventually, the routing capacity can be used to generate a congestion map for a circuit design, which can facilitate routing (e.g., global routing) of a net of the circuit design (e.g., clock net, data net, etc.). For some embodiments, the modeling of pin density described herein can be combined with one or more other techniques for modeling pin density within a circuit design. As described herein, a pin access layer can be a layer of a circuit design that can be used to connect (e.g., with a routing net) one or more pins of the circuit design.

For some embodiments, a list of pins and wire width information for layers of a circuit design are received, a pin distribution (e.g., layer pin count) of each of one or more layers of the circuit design is determined (e.g., computed) based on the list of pins, and a classification (e.g., ignore, pin layer, pin access layer, other, etc.) of each of one or more layers of the circuit design is determined based on the layer's pin distribution and wire width information. In this way, such embodiments can facilitate pin layer and pin access layer recognition based on a number of pins per layer.

A set of classifications resulting for the one or more layers of the circuit design is used to adjust routing capacity of a grid cell based on pin density as described herein. For instance, some embodiments receive the list of pins of the circuit design and a list of grid cells (of layers) of the circuit design, iterate through the list of pins and determine a number of pins per a grid cell (e.g., grid cell pin count) of the list of grid cells. Then, for each layer of the circuit design, various embodiments determine (e.g., find or identify) one or more grid cells of the list of grid cells whose number of pins is larger than a threshold value (e.g., user defined threshold value) and reduce a routing capacity of each determined grid cell that is associated with a layer having a specific classification, such as a pin layer or a pin access layer classification, or that is associated a layer marked by a user. After the routing capacity of one or more grid cells are adjusted in this way, routing (e.g., global routing) can be performed on the circuit design based on the one or more grid cells with adjusted routing capacities. For instance, the adjusted routing capacity of the grid cells can be used to generate a congestion map for the circuit design (e.g., generated based on resulting demands of the grid cells), which can be used during routing (e.g., global routing) of a net of the circuit design (e.g., clock net, data net, etc.).

By not considering pin density early (e.g., during global routing), conventional circuit design routing can end up with an inaccurate understanding about congestion and resources available in a grid cell during global routing, which in turn can cause a mismatch in routability of grid cells between global routing and detailed routing. Based on this mismatch, detailed routing for conventional circuit design routing will cause DRC violations that could otherwise be avoided (e.g., by use of an embodiment described herein).

In contrast, by considering pin density in modeling routing capacity of grid cells, various embodiments described herein represent an improvement over conventional circuit design routing (e.g., global routing) techniques, and can block grid cell(s) by way of the capacity modeling, thereby causing circuit design routing to avoid routing through those blocked grid cell(s). Specifically, various embodiments described herein can model pin density within one or more grid cells, and can report or detect routing congestion in one or more grid cells caused by the pin density. In this way, various embodiments can enable circuit design routing (e.g., global routing) to be aware of pin layers and pin access layers in the early stages of circuit design routing (e.g., early stages of global routing) so that routing congestion can be addressed ahead of time. Various embodiments can enable detection of grid cell congestion with improved accuracy. In doing so, various embodiments can improve a computer system's ability to perform global routing and can reduce congestion that results at the end of global routing. Use of various embodiments described herein for pin density modeling can achieve Quality of Result (QoR), and can converge to a routing solution faster and more easily (e.g., based on placement being able to spread grid cells with pins and get a better routability picture) than conventional circuit design routing techniques.

Depending on the embodiment, modeling routing capacity of grid cells (e.g., modeling routing congestion) based on pin density (as described herein) can be performed as part of global routing and prior to detailed routing.

As used herein, global routing can comprise determining a routing plan (e.g., one or more routing guides) for routing a physical wire (e.g., interconnect line or wire) within a circuit design between two or more nodes of circuit design (e.g., two pins or a source and a pin). For instance, global routing can route a wire (of a net of the circuit design) within the circuit design by dividing the circuit design (e.g., dividing each of one or more layers of the circuit design) into a grid of cells (e.g., grid cells), where each cell comprises a set number of resources (e.g., horizontal and vertical resources, such as tracks) for routing the wire. For some embodiments, each layer of a circuit design comprises its own grid of cells (e.g., grid cells). Additionally, for some embodiments, a routing blockage of a circuit design (e.g., on a layer of the circuit design) is marked with respect to a cell (e.g., grid cell) in the grid. Global routing can consider/account for one or more routing blockages of the circuit design when determining a route plan for a wire within the circuit design.

Global routing can route a wire (of the net) by assigning the net to a set of specific cells and a set of specific layers (metal layers) of the circuit design. In doing so, global routing can generate a routing plan for the wire that describes a set of connected cells (e.g., grid cells), between two or more nodes of the circuit design, that does not include obstructed cells. The routing plan (e.g., global routing plan) can comprise one or more routing guides that serve as "loose" routing paths or routing areas within which detailed routing can route a physical wire between two or more nodes (e.g., pins) of a circuit design.

As used herein, detailed routing can comprise routing a physical wire (e.g., interconnect wire) within a circuit design, between two or more nodes of the circuit design, based on a routing plan determined by global routing for the circuit design. The routing plan can provide a detailed routing process with a topology for routing wires, which in turn can enable detailed routing to route wires without violating one or more design rule constraints (DRCs) associated with a circuit design. This can be referred to as detailed routing being performed with clean DRCs. Accordingly, for some embodiments, global routing is performed on a circuit design prior to detailed routing being performed on the circuit design. Generally, global routing can be performed on a circuit design faster than performing detailed routing on the same circuit design. The routed wires of a circuit design can form a network of the circuit design.

As used herein, a congestion map can describe a measure (e.g., estimated measure) of routing congestion for a set of grid cells on layer(s) (e.g., metal layers) of a circuit design, where the layers serve as interconnect structures for the circuit design. A measure of routing congestion for a given grid cell can be represented by one or more congestion ratios, such as one ratio for a horizontal routing resource and another ratio for a vertical routing resource. For example, a congestion ratio for a horizontal routing resource of a given grid can comprise a total number of horizontal routing resources demanded from the given grid cell by circuit elements (e.g., logical devices of the circuit design) within the given grid cell, divided by a total number of horizontal routing resources available (supplied) by the given grid cell. A congestion map can be implemented as a data structure, such as a two-dimensional array, for storing measured interconnect congestion for individual cells of the set of grid cells.

As used herein, a capacity map can describe a measure of routing resource capacity of a set of grid cells for layer(s) of a circuit design, such as horizontal and vertical resources (e.g., tracks) for routing a wire through each grid cell. For some embodiments, a capacity map is used by global routing to generate a set of routing guides between at least two nodes of the circuit design (e.g., between two pins or between a source and a pin). A capacity map for a circuit design can be generated based on a routing resource capacity (or routing capacity) of a set of grid cells for one or more layers of the circuit design.

Reference will now be made in detail to embodiments of the present disclosure, examples of which are illustrated in the appended drawings. The present disclosure may, however, be embodied in many different forms and should not be construed as being limited to the embodiments set forth herein.

FIG. 1 is a diagram illustrating an example design process flow 100 for adjusting routing capacity of a grid cell based on pin density, according to some embodiments. As shown, the design process flow 100 includes a design phase 110, a device fabrication phase 120, a design verification phase 130, and a device verification phase 140. The design phase 110 involves an initial design input 112 operation where the basic elements and functionality of a device are determined, as well as revisions based on various analyses and optimization of a circuit design. This design input 112 operation is where block instances are used in the circuit design and any additional circuitry for the design around the blocks is selected. The initial strategy, tactics, and context for the device to be created are also generated in the design input 112 operation, depending on the particular design algorithm to be used.

In some embodiments, following an initial selection of design values in the design input 112 operation, routing, timing analysis, and optimization are performed in a routing and optimization 114 operation, along with any other automated design processes. Though not shown, the routing and optimization 114 operation can include a clock tree synthesis (CTS) operation, which can generate one or more clock trees that deliver clock signal from clock sources of a circuit design to a plurality of clock tree leaf nodes comprising clock tree pins (e.g., of circuit devices, such as flip-flops) within the circuit design. The routing and optimization 114 operation may also include other operations not shown, such as those relating to floorplanning, placement, post-placement optimization, and post-routing optimization. As shown, the routing and optimization 114 operation includes a routing capacity adjustment based on pin density operation 115, which may be performed in accordance with various embodiments described herein. For some embodiments, operation 115 can be performed prior to detailed routing of a circuit design and, more particularly, during (e.g., as part of) global routing of the circuit design.

While the design process flow 100 shows optimization occurring prior to a layout instance 116, timing analysis and optimization may be performed at any time to verify operation of a circuit design. For instance, in various embodiments, timing analysis in a circuit design may be performed prior to routing of connections in the circuit design, after routing, during register transfer level (RTL) operations, or as part of a signoff 118, as described below.

Design inputs are used in the design input 112 operation to generate an initial circuit layout. The design inputs may be further processed during the design input 112 operation via a process, such as logic-synthesis, to generate a circuit netlist mapped to a target standard library manufacturable by the foundry in fabrication 122 operation. After design inputs are used in the design input 112 operation to generate an initial circuit layout, and any of the routing and optimization 114 operations are performed, a resulting layout is generated as the layout instance 116. The netlist as placed by the layout instance 116 describes the physical layout dimensions of the device that match the design inputs. Prior to this layout being provided to a fabrication 122 operation, the signoff 118 is performed on the circuit design defined by the layout.

After signoff verification by the signoff 118, a verified version of the layout is used in the fabrication 122 operation to generate a device, or additional testing and design updates may be performed using designer inputs or automated updates based on design simulation 132 operations or extraction, 3D modeling, and analysis 144 operations. Once the device is generated, the device can be tested as part of device test 142 operations, and layout modifications generated based on actual device performance.

As described in more detail below, a design update 136 from the design simulation 132; a design update 146 from the device test 142 or the extraction, 3D modeling, and analysis 144 operations; or the design input 112 operation may occur after the initial layout instance 116 is generated. In various embodiments, whenever design inputs are used to update or change an aspect of a circuit design, a timing analysis and the routing and optimization 114 operation may be performed.

FIGS. 2 through 7 are flowcharts illustrating example methods for adjusting routing capacity of one or more grid cells of one or more layers of a circuit design based on pin density, according to some embodiments. It will be understood that example methods described herein may be performed by a device, such as a computing device executing instructions of an EDA software system, in accordance with some embodiments. Additionally, example methods described herein may be implemented in the form of executable instructions stored on a computer-readable medium or in the form of electronic circuitry. For instance, the operations of a method 200 of FIG. 2 may be represented by executable instructions that, when executed by a processor of a computing device, cause the computing device to perform the method 200. Depending on the embodiment, an operation of an example method described herein may be repeated in different ways or involve intervening operations not shown. Though the operations of example methods may be depicted and described in a certain order, the order in which the operations are performed may vary among embodiments, including performing certain operations in parallel.

Figure 2:
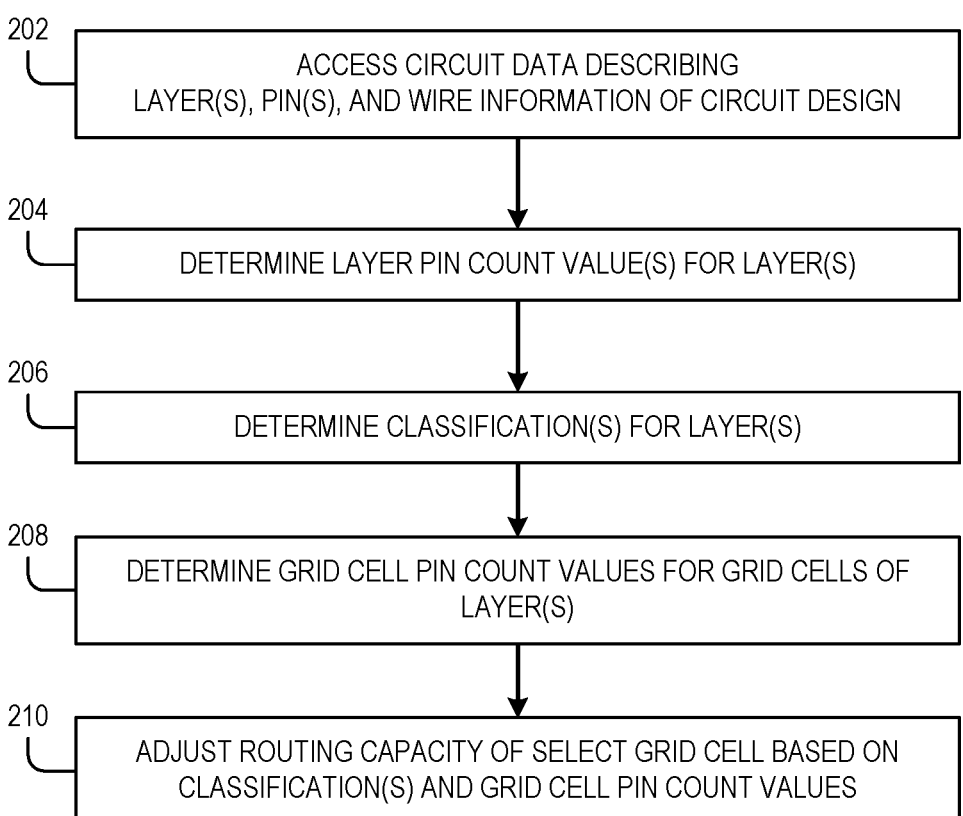

Referring now to FIG. 2, the flowchart illustrates an example method 200 for adjusting routing capacity of one or more grid cells of one or more layers of a circuit design based on pin density, according to some embodiments. For some embodiments, the method 200 is performed as part of a global routing process with respect to a circuit design (e.g., by an EDA software system). An operation of the method 200 (or another method described herein) may be performed by a hardware processor (e.g., central processing unit or graphics processing unit) of a computing device (e.g., desktop, server, etc.).

As illustrated, operation 202 of the method 200 accesses circuit data that describes a set of layers (e.g., all layers) of a circuit design, a set of pins of the circuit design, and a set of wire information for the set of layers. The wire information can include, without limitation, wire width values and pitch values. The circuit data can data describing, without limitation, one or more of grid cell location, a layer stack (e.g., comprising layers at different horizontal levels), pin locations, and pre-routed wires of the circuit design.

The method 200 continues with operation 204 determining (e.g., generating) a set of layer pin count values for the set of layers (e.g., pin distribution value per layer). For some embodiments, operation 204 comprises determining a layer pin count value (e.g., pin density value) for each individual layer of the set of layers based on the circuit data. For instance, operation 204 can comprise initializing the set of layer pin count values, and for each individual pin in the set of pins (e.g., iterating through individual pins): determining to which single layer, in the set of layers, the individual pin belongs; and incrementing a single layer pin count value in the set of layer pin count values corresponding to the single layer. In this way, operation 204 can iterate through all pins of the circuit design and determine (e.g., compute) a pin distribution per layer. More regarding an example implementation of operation 204 is described with respect to FIG. 4.

Operation 206 of method 200 determines (e.g., generates) a set of classifications for the set of layers. For some embodiments, operation 206 comprises classifying each individual layer of the set of layers based on: an individual layer pin count value in the set of layer pin count values corresponding to the individual layer; and an individual wire width value in the set of wire width values corresponding to the individual layer. For instance, operation 206 can classify an individual layer: with an ignore classification in response to the individual layer pin count value indicating that the individual layer has no pins and is below any pin layer or that the individual layer has no tracks; with a pin layer classification in response to the individual layer pin count value surpassing a pin threshold value; with a pin access layer classification in response to the individual layer being disposed right above a lower layer in the set of layers having a pin layer classification; with a pin access layer classification in response to the individual layer being disposed within a range of layers (e.g., two successive layers) above a lower layer in the set of layers having a pin layer classification; with a pin access layer classification in response to the individual wire width value of the individual layer satisfying a pin access layer criterion; or with an other-type layer classification in response to the individual layer being disposed above a lower layer in the set of layers having a pin access layer classification. The pin access layer criterion can be satisfied, for example, if a calculated ratio associated with the individual layer surpasses (e.g., in response to the calculated ratio surpassing) a predetermined threshold value. The calculated ratio can comprise a ratio of the individual wire width value of the individual layer and a single wire width value of a lower layer (in the set of layers) that is right below the individual layer. The predetermined threshold value can comprise a predetermined ratio (e.g., a value between 0 and 1), which can be user-defined. More regarding the calculated ratio and the predetermined ratio is described with respect to FIG. 5. Depending on the embodiment, a layer with an ignore classification can be a bottommost layer of a circuit without any pins, and can be skipped. A layer with a pin layer classification can be a layer where most of the pins of the circuit design are disposed. A layer with a pin access layer classification can be used by a router (e.g., global route) to generate one or more local connections for a net of the circuit design. A layer with an other-type layer classification can be a layer above one or more layers having a pin access layer designation. For some embodiments, operation 206 is performed from a bottom layer to a top layer of the set of layers (e.g., by iterating through the set of layers from a bottom layer to a top layer).

At operation 208 of the method 200, a set of grid cell pin count values (e.g., pin density values) is determined (e.g., generated) for a plurality of grid cells of the set of layers. For some embodiments, operation 208 comprises determining a grid cell pin count value for each grid cell of the plurality of grid cells based on the circuit data. For instance, operation 208 can comprise initializing the set of grid cell pin count values, and for each individual pin in the set of pins (e.g., iterating through individual pins): determining to which individual grid cell (e.g., in the plurality of grid cells of the circuit design) the individual pin belongs; and incrementing an individual grid cell pin count value in the set of grid cell pin count values corresponding to the individual grid cell. More regarding an example implementation of operation 208 is described with respect to FIG. 6.

The method 200 continues with operation 210 adjusting a routing capacity of a select grid cell in the plurality of grid cells based on the set of classifications (determined by operation 206) and the set of grid cell pin count values (determined by operation 208). For some embodiments, operation 210 is performed with respect to each of two or more grid cells in the plurality of grid cells. Depending on the embodiment, operation 210 can comprise determining a subset of layers (of the set of layers) based on the set of classifications, and adjusting a routing capacity of one or more select grid cells of the subset of layers based on grid cell pin count values of one or more select grid cells satisfying a grid cell adjustment criterion.

For instance, operation 210 can comprise determining whether a select layer (of the set of layers) satisfies a layer classification criterion based on a select classification in the set of classifications (determined by operation 206) corresponding to the select layer. In response to determining that the select layer satisfies the layer classification criterion, a subset of grid cells of the select layer can be determined (e.g., identified) from the plurality of grid cells, where each grid cell in the subset of grid cells satisfies a grid cell adjustment criterion. Thereafter, a routing capacity of one or more select grid cells (e.g., all grid cells) in the subset of grid cells can be adjusted. An example of this is illustrated and described with respect to method 300 of FIG. 3.

Depending on the embodiment, the layer classification criterion can be satisfied by the select layer if the select classification comprises (e.g., in response to the select classification being) either a pin layer classification, a pin access layer classification, or a marked-by-user layer classification (e.g., a layer marked or designated by a user). The grid cell adjustment criterion can be satisfied by an individual grid cell, for example, if an individual grid cell pin count value of the individual grid cell surpasses (e.g., in response to the individual grid cell pin count value surpassing) a predetermined threshold value, where the predetermined threshold value can be a user-defined value. Additionally, operation 210 can be performed for two or more (e.g., all) layers in the set of layers.

To adjust a routing capacity of a select grid cell, some embodiments determine (e.g., calculated or computed) a pin density penalty value for the individual grid cell based on at least one of: a capacity per track of the select grid cell; a layer density factor associated with the select grid cell; or a grid cell pin count value (e.g., in the set of grid cell pin count values generated by operation 208) corresponding to the select grid cell. Thereafter, the determined pin density penalty value can be applied to the routing capacity of the select grid cell. In particular, applying of the determined pin density penalty value to the routing capacity of the select grid cell can comprise decreasing the routing capacity of the select grid cell by the pin density penalty value while maintaining a minimum routing capacity per track (CPT). More regarding an example implementation of operation 210 is described with respect to FIG. 7.

Referring now to FIG. 3, the flowchart illustrates an example method 300 for adjusting a routing capacity of a grid cell of a layer based on a classification of the layer and a grid cell pin count value of the grid cell, according to some embodiments. For instance, the method 300 can represent an example implementation of operation 210. As illustrated, operation 302 of the method 300 determines whether a select layer (e.g., of a circuit design) satisfies a layer classification criterion based on a classification of the select layer (e.g., based on a select classification in the set of classifications determined by operation 206 corresponding to the select layer). In response to determining that the select layer satisfies the layer classification criterion, operation 304 of the method 300 determines (e.g., identifies), from a plurality of grid cells of the circuit design, a subset of grid cells of the select layer that each satisfy a grid cell adjustment criterion. Thereafter, operation 306 of the method 300 adjusts a routing capacity of one or more select grid cells (e.g., all grid cells) in the subset of grid cells.

Figure 4:
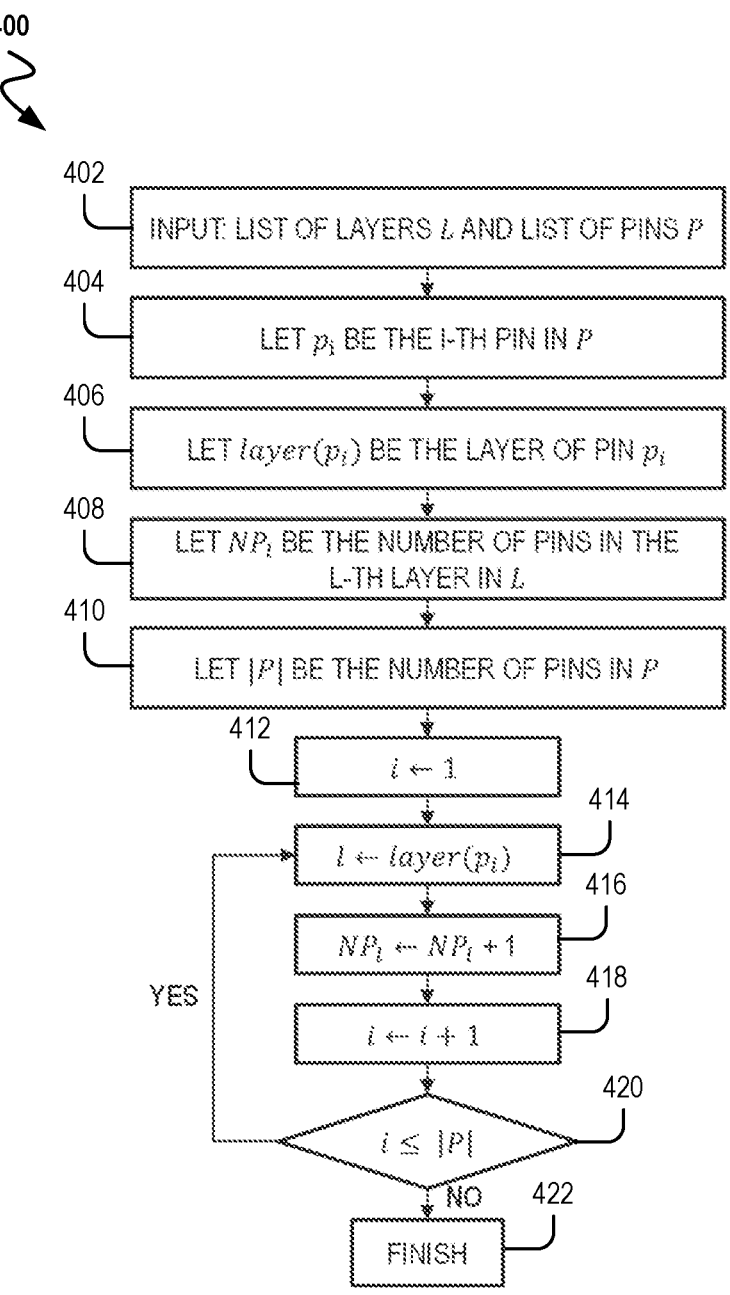

Referring now to FIG. 4, the flowchart illustrates an example method 400 that represents an implementation of determining a set of layer pin count values (e.g., pin distribution values) for a set of layers (e.g., operation 204 of the method 200 of FIG. 2). As illustrated, at operation 402 of the method 400, a list of layers L and a list of pins P of a circuit design are received as input. Operation 404 initializes (e.g., creates) variable $p_i$ to be the i-th pin in the list of pins P, operation 406 initializes (e.g., creates) variable layer ($p_i$) to be the layer of the i-th pin $p_i$, operation 408 initializes (e.g., creates) variable $NP_l$ to be the number of pins (e.g., layer pin count) in the L-th layer in the list of layers L, operation 410 initializes (e.g., creates) variable |P| to be the number of pins in the list of pins P, and operation 412 initializes (e.g., creates) an iteration count variable i with a value of one.

The method 400 continues with operation 414 setting a current layer variable l to layer ($p_i$), which is the layer of the i-th pin $p_i$. Then, operation 416 increments $NP_l$ by one (by setting $NP_l$ to $NP_l+1$), and operation 418 increments i by one (by setting i to i+1), to represent another iteration of the method 400 has been performed. Thereafter, if the value of i is less than or equal to |P| (the number of pins in the list of pins P) at operation 420, the method 400 returns to operation 414. However, if the value of i is not less than or equal to |P| (the number of pins in the list of pins P) at operation 420, the method 400 finishes at operation 422.

Referring now to FIG. 5, the flowchart illustrates an example method 500 that represents an implementation of determining a set of classifications for a set of layers (e.g., operation 206 of the method 200 of FIG. 2). As illustrated, at operation 502 of the method 500, a list of layers L, a number of pins |P| for a list of pins P, and a number of pins per a layer NP of a circuit design are received as input. Operation 504 initializes (e.g., creates) variables $T_1$ and $T_2$ to be ratios to be considered for pin layers and pin access layer classifications, respectively. $T_1$ can be a predetermined ratio (e.g., a value between 0 and 1) used to classify a layer with a pin layer classification, which can be user-defined. $T_2$ can be a predetermined ratio (e.g., a value between 0 and 1) used to classify a layer with a pin access layer classification, which can be user-defined. For various embodiments, $T_1$ and $T_2$ are regarded as separate ratios. Operation 506 initializes (e.g., creates) variable $l_i$ to be the i-th layer in the list of layers L, operation 508 initializes (e.g., creates) variable $C_i$ to be layer classification of the i-th layer $l_i$ in the list of layers L, and operation 510 initializes (e.g., creates) variable $NP_i$ to be the number of pins (e.g., layer pin count) in the i-th layer $l_i$ in the list of layers L, and operation 512 initializes (e.g., creates) an iteration count variable i with a value of one.

Subsequently, if $NP_i=0$ is true at operation 514, the method 500 proceeds to operation 520, and if $NP_i=0$ is false at operation 514, the method 500 proceeds to operation 516. Operation 520 sets the layer classification $C_i$ of the i-th layer $l_i$ to an ignore layer classification ("TOIGNORE") and increments i by one (by setting i to i+1). The method 500 then continues to operation 530. If the value of i is less than or equal to |L| (the number of layers in the list of layers L) at operation 530, the method 500 returns to operation 514. However, if the value of i is not less than or equal to |L| (the number of layers in the list of layers L) at operation 530, the method 500 finishes at operation 540.

If NP; is greater than or equal to $T_1 \times |P|$ at operation 516, the method 500 proceeds to operation 522, and if $NP_i$ is not greater than or equal to $T_1 \times |P|$ at operation 516, the method 500 proceeds to operation 518. Operation 522 sets the layer classification $C_i$ of the i-th layer $l_i$ to a pin layer classification ("PINLAYER") and increments i by one (by setting i to i+1). Accordingly, while the number of pins is larger than a threshold defined by $T_1 \times |P|$, operation 522 classifies the i-th layer $l_i$ with a pin layer classification. If the value of i is less than or equal to |L| (the number of layers in the list of layers L) at operation 532, the method 500 returns to operation 516. However, if the value of i is not less than or equal to |L| (the number of layers in the list of layers L) at operation 532, the method 500 finishes at operation 540.

If the layer classification $C_{i-1}$ of the (i−1)-th layer (e.g., the last layer) is a pin layer classification, if the layer classification $C_{i-2}$ of the (i−2)-th layer (e.g., the second to last layer) is a pin layer classification, or if the wire width ratio $W_i/W_{i-1}$ is less than $T_2$ at operation 518, the method 500 proceeds to operation 524. For various embodiments, $W_i$ is the wire width of the i-th layer $l_i$ and $W_{i-1}$ is the wire width of the (i−1)-th layer (e.g., the last layer), which can be provided by the wire width information (e.g., wire width values) provided by circuit design data for the circuit design. However, if the layer classification $C_{i-1}$ of the (i−1)-th layer (e.g., the last layer) is not a pin layer classification, the layer classification $C_{i-2}$ of the (i−2)-th layer (e.g., the second to last layer) is not a pin layer classification, and the wire width ratio $W_i/W_{i-1}$ is not less than $T_2$ at operation 518, the method 500 proceeds to operation 526.

At operation 524, the layer classification $C_i$ of the i-th layer $l_i$ is set to a pin access layer classification ("PINALAYER") and increments i by one (by setting i to i+1). As a result, for the next two layers above a layer classified with a pin layer classification, operation 524 classifies the next two layers with a pin access layer classification (regardless of whether the wire width ratio $W_i/W_{i-1}$ is less than $T_2$). If the value of i is less than or equal to |L| (the number of layers in the list of layers L) at operation 534, the method 500 returns to operation 518. However, if the value of i is not less than or equal to |L| (the number of layers in the list of layers L) at operation 534, the method 500 finishes at operation 540.

At operation 526, the layer classification Ciof the i-th layer $l_i$ is set to an other-type classification ("OTHER") and increments i by one (by setting i to i+1). If the value of i is less than or equal to |L| (the number of layers in the list of layers L) at operation 536, the method 500 returns to operation 518. However, if the value of i is not less than or equal to |L| (the number of layers in the list of layers L) at operation 536, the method 500 finishes at operation 540.

Figure 6:
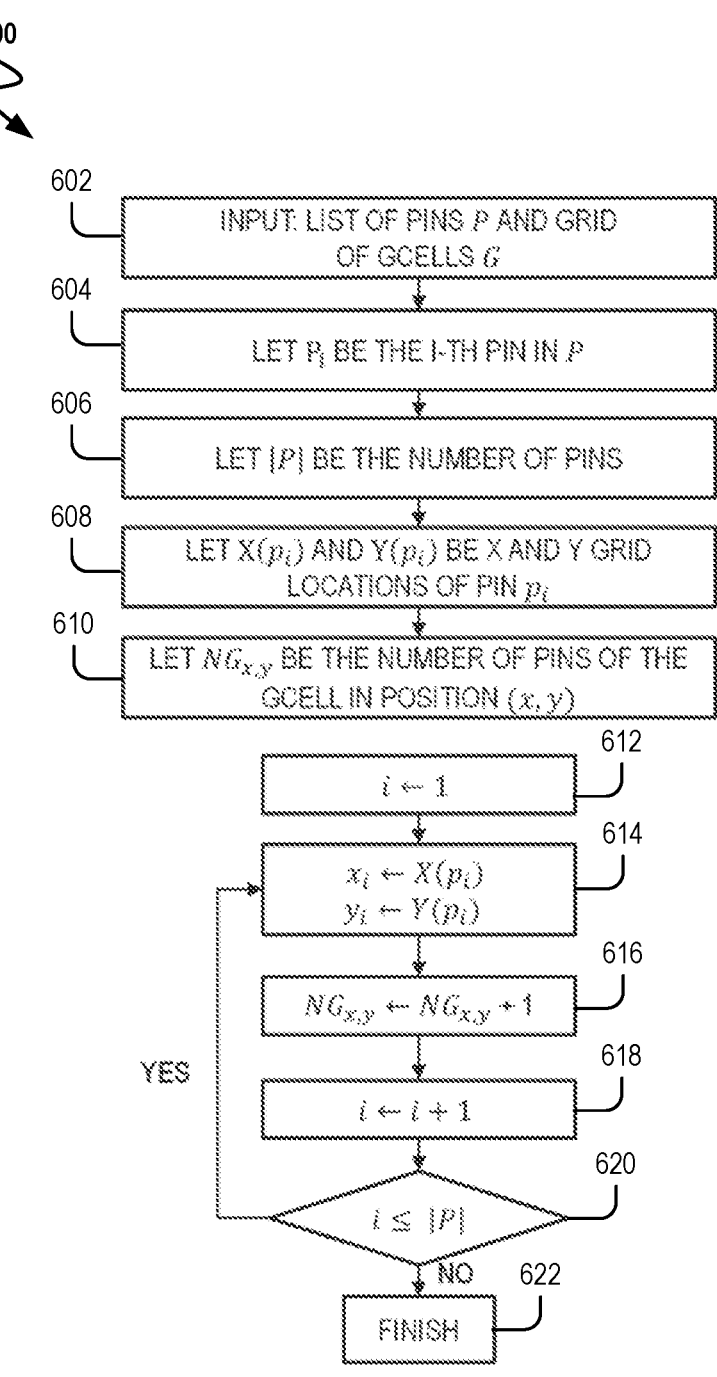

Referring now to FIG. 6, the flowchart illustrates an example method 600 that represents an implementation of determining a set of grid cell pin count values (e.g., pin density values) for a plurality of grid cells of a set of layers (e.g., operation 208 of the method 200 of FIG. 2). As illustrated, at operation 602 of the method 600, a list of pins P and a grid (e.g., list) of grid cells G of a circuit design are received as input. Operation 604 initializes (e.g., creates) variable p; to be the i-th pin in the list of pins P, operation 606 initializes (e.g., creates) variable |P| to be the number of pins in the list of pins P, operation 608 initializes (e.g., creates) coordinate variables $X(p_i)$ and $Y(p_i)$ to be X and Y coordinates for a grid location of the i-th pin $p_i$, operation 610 initializes (e.g., creates) variable $NP_{X,Y}$ to be the number of pins (e.g., grid cell pin count) for a grid cell at a location corresponding to the X and Y coordinates, and operation 612 initializes (e.g., creates) an iteration count variable i with a value of one.

The method 600 continues with operation 614 setting a current X coordinate variable $x_i$ to $X(p_i)$ and a current Y coordinate variable $y_i$ to $Y(p_i)$, where $X(p_i)$ and $Y(p_i)$ represent the coordinates for the location of the i-th pin $p_i$. Then, operation 616 increments $NP_{X,Y}$ by one (by setting $NP_{X,Y}$ to $NP_{X,Y}+1$), and operation 618 increments i by one (by setting i to i+1), to represent another iteration of the method 600 has been performed. Thereafter, if the value of i is less than or equal to |P| (the number of pins in the list of pins P) at operation 620, the method 600 returns to operation 614. However, if the value of i is not less than or equal to |P| (the number of pins in the list of pins P) at operation 620, the method 600 finishes at operation 622.

Referring now to FIG. 7, the flowchart illustrates an example method 700 that represents an implementation of adjusting a routing capacity of a grid cell in a plurality of grid cells of a set of layers based on a set of classifications and a set of grid cell pin count values (e.g., operation 210 of the method 200 of FIG. 2). As illustrated, at operation 702 of the method 700, a list of layers L of a circuit design is received as input. Operation 704 initializes (e.g., creates) variable $l_i$ to be the i-th layer in the list of layers L, variable $DF_i$ to be a user density factor (e.g., user-defined density factor value) for the i-th layer $l_i$ in the list of layers L (which can indicate whether a user has an interest in adjusting routing capacity of the i-th layer $l_i$ regardless of its layer classification), variable $C_i$ to be layer classification of the i-th layer $l_i$ in the list of layers L, variable $PDP_j$ to be a pin density penalty in the j-th grid cell of the i-th layer $l_i$ in the list of layers L, variable CPT to be routing capacity per track, variable $NG_j$ to be the number of pins (e.g., layer pin count) in the j-th grid cell of the i-th layer $l_i$ in the list of layers L, variable $T_3$ to be a threshold value (e.g., user defined threshold value) for pin density, and variable |G| to be the number of grid cells of the i-th layer $l_i$ in the list of layers L. Operation 706 initializes (e.g., creates) an iteration count variable i with a value of one.

The method 700 continues with operation 708, where if $DF_i=0.0$ is true, the layer classification $C_i$ of the i-th layer $l_i$ is not a pin layer classification, and the layer classification $C_i$ of the i-th layer $l_i$ is not a pin access layer classification, the method 700 proceeds to operation 730. This can effectively ignore or avoid adjusting a routing capacity of any grid cells on the i-th layer. However, if $DF_i=0.0$ is false (e.g., which can mean the user is interested in adjusting routing capacity of the i-th layer regardless of layer classification), the layer classification $C_i$ of the i-th layer $l_i$ is a pin layer classification, or the layer classification $C_i$ of the i-th layer $l_i$ is a pin access layer classification, the method 700 continues to operation 710.

At operation 730, i is incremented by one (by setting i to i+1). Thereafter, if the value of i is less than or equal to |L| (the number of layers in the list of layers L) at operation 732, the method 700 returns to operation 708. However, if the value of i is not less than or equal to |L| (the number of layers in the list of layers L) at operation 732, the method 700 finishes at operation 740.

At operation 710, an iteration count variable j is initialized (e.g., created) with a value of one. Then, operation 712 determines (e.g., calculates) the pin density penalty $PDP_j$ in the j-th grid cell by the following Formula 1:

$$PDP_j=CPT \times DF_i \times MAX(NG_j-T_3, 0)/T_3,$$

where MAX represents a maximum function that provides the maximum of $NG_j-T_3$ and 0. By operation 712, the pin density penalty $PDP_j$ of each j-th grid cell can be computed as a product of the capacity per track, user density factor $DF_i$ and the density of pins $NG_j$. Thereafter, operation 714 determines (e.g., calculates) a routing capacity $CAP_j$ of the j-th grid cell of the i-th layer $l_i$, which as determined by operation 714 can represent an adjusted routing capacity. In particular, operation 714 determines the routing capacity $CAP_j$ of the j-th grid cell by the following Formula 2:

$$CAP_j=MAX(CAP_j-PDP_j, CPT),$$

where MAX represents a maximum function that provides the maximum of $CAP_j-PDP_j$ and a minimum capacity per track (CPT). In this way, operation 714 can decrease the routing capacity in the j-th grid cell by the pin density penalty $PDP_j$ in the j-th grid cell, while maintaining a minimum CPT, which can mean at least one track is left available. Afterward, operation 716 increments j by one (by setting j to j+1) and the method 700 proceeds to operation 718.

If the value of j is less than or equal to |G| (the number of grid cells in the i-th layer $l_i$) at operation 718, the method 700 returns to operation 712. However, if the value of j is not less than or equal to |G| (the number of grid cells in the i-th layer $l_i$) at operation 718, the method 700 proceeds to operation 720, where i is incremented by one (by setting i to i+1) and the method 700 continues to operation 722.

If the value of i is less than or equal to |L| (the number of layers in the list of layers L) at operation 722, the method 700 returns to operation 710. However, if the value of i is not less than or equal to |L| (the number of layers in the list of layers L) at operation 722, the method 700 finishes at operation 740.

For some embodiments, operations 706, 720, 722, 730, 732 enable the method to iterate through every layer of the list of layers L from a bottom layer (0-th layer) to a top layer (|L|-th layer).

FIG. 8 is a diagram illustrating example grid cells 800, 810 that illustrate a difference in routing capacity based on pin density within the grid cell, according to some embodiments. In particular, grid cell 800 comprises four tracks 802, two pins 804, and wires 806. Grid cell 810 comprises four tracks 812, four pins 814, and wires 816. While both grid cells 800 and 810 comprise a similar number of tracks (802, 812) and their respective wires (wires 806, wires 816) occupying similar portions of their respective tracks, grid cell 810 has more pins (and thus higher pin density) than grid cell 800. As a result, various embodiments described herein could adjust the routing capacity of grid cell 800 to be four (4) based on its pin density, while adjusting the routing capacity of grid cell 810 to be lower at three (3) based on its higher pin density.

Figure 9:
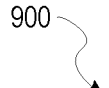
FIG. 9 is a block diagram illustrating an example of a software architecture that may be operating on an electronic design automation (EDA) computing device and may be used with methods for adjusting routing capacity of a grid cell based on pin density, according to some embodiments.

FIG. 9 is a block diagram 900 illustrating an example of a software architecture 902 that may be operating on an EDA computer and may be used with methods for adjusting routing capacity of one or more grid cells of one or more layers of a circuit design based on pin density, according to some embodiments. The software architecture 902 can be used as an EDA computing device to implement any of the methods described above. Aspects of the software architecture 902 may, in various embodiments, be used to store circuit designs, and to facilitate generation of a circuit design in an EDA environment by adjusting routing capacity of one or more grid cells of one or more layers of a circuit design based on pin density.

FIG. 9 is merely a non-limiting example of a software architecture 902, and it will be appreciated that many other architectures can be implemented to facilitate the functionality described herein. In various embodiments, the software architecture 902 is implemented by hardware such as a machine 1000 of FIG. 10 that includes processors 1010, memory 1030, and I/O components 1050. In this example, the software architecture 902 can be conceptualized as a stack of layers where each layer may provide a particular functionality. For example, the software architecture 902 includes layers such as an operating system 904, libraries 906, software frameworks 908, and applications 910. Operationally, the applications 910 invoke application programming interface (API) calls 912 through the software stack and receive messages 914 in response to the API calls 912, consistent with some embodiments. In various embodiments, any client device, any server computer of a server system, or any other device described herein may operate using elements of the software architecture 902. An EDA computing device described herein may additionally be implemented using aspects of the software architecture 902, with the software architecture 902 adapted for operating routing capacity adjustment in any manner described herein.

In some embodiments, an EDA application of the applications 910 performs routing capacity adjustment according to embodiments described herein using various modules within the software architecture 902. For example, in some embodiments, an EDA computing device similar to the machine 1000 includes the memory 1030 and the one or more processors 1010. The processors 1010 also implement a (circuit design) routing capacity adjustment based on pin density module 942 for adjusting routing capacity of one or more grid cells of one or more layers of a circuit design based on pin density, in accordance with various embodiments described herein.

In various other embodiments, rather than being implemented as modules of the one or more applications 910, the routing capacity adjustment based on pin density module 942 may be implemented using elements of the libraries 906, the operating system 904, or the software frameworks 908.

In various implementations, the operating system 904 manages hardware resources and provides common services. The operating system 904 includes, for example, a kernel 920, services 922, and drivers 924. The kernel 920 acts as an abstraction layer between the hardware and the other software layers, consistent with some embodiments. For example, the kernel 920 provides memory management, processor management (e.g., scheduling), component management, networking, and security settings, among other functionality. The services 922 can provide other common services for the other software layers. The drivers 924 are responsible for controlling or interfacing with the underlying hardware, according to some embodiments. For instance, the drivers 924 can include display drivers, signal-processing drivers to optimize modeling computation, memory drivers, serial communication drivers (e.g., Universal Serial Bus (USB) drivers), WI-FI® drivers, audio drivers, power management drivers, and so forth.

In some embodiments, the libraries 906 provide a low-level common infrastructure utilized by the applications 910. The libraries 906 can include system libraries 930 such as libraries of blocks for use in an EDA environment or other libraries that can provide functions such as memory allocation functions, string manipulation functions, mathematic functions, and the like. In addition, the libraries 906 can include API libraries 932 such as media libraries (e.g., libraries to support presentation and manipulation of various media formats such as Joint Photographic Experts Group (JPEG or JPG), or Portable Network Graphics (PNG)), graphics libraries (e.g., an OpenGL framework used to render in two dimensions (2D) and three dimensions (3D) in a graphic context on a display), database libraries (e.g., SQLite to provide various relational database functions), web libraries (e.g., WebKit to provide web browsing functionality), and the like. The libraries 906 may also include other libraries 934.

The software frameworks 908 provide a high-level common infrastructure that can be utilized by the applications 910, according to some embodiments. For example, the software frameworks 908 provide various graphic user interface (GUI) functions, high-level resource management, high-level location services, and so forth. The software frameworks 908 can provide a broad spectrum of other APIs that can be utilized by the applications 910, some of which may be specific to a particular operating system 904 or platform. In various embodiments, the systems, methods, devices, and instructions described herein may use various files, macros, libraries, and other elements of an EDA design environment to implement routing capacity adjustment based on pin density as described herein. This includes analysis of input design files for an integrated circuit design, along with any element of hierarchical analysis that may be used as part of or along with the embodiments described herein. While netlist files, library files, SDC files, and view definition files are examples that may operate within the software architecture 902, it will be apparent that other files and structures may provide a similar function, in various embodiments.

Certain embodiments are described herein as including logic or a number of components, modules, elements, or mechanisms. Such modules can constitute either software modules (e.g., code embodied on a machine-readable medium or in a transmission signal) or hardware modules. A "hardware module" is a tangible unit capable of performing certain operations and can be configured or arranged in a certain physical manner. In various embodiments, one or more computer systems (e.g., a standalone computer system, a client computer system, or a server computer system) or one or more hardware modules of a computer system (e.g., a processor or a group of processors) are configured by software (e.g., an application or application portion) as a hardware module that operates to perform certain operations as described herein.

In some embodiments, a hardware module is implemented mechanically, electronically, or any suitable combination thereof. For example, a hardware module can include dedicated circuitry or logic that is permanently configured to perform certain operations. For example, a hardware module can be a special-purpose processor, such as a field-programmable gate array (FPGA) or an application-specific integrated circuit (ASIC). A hardware module may also include programmable logic or circuitry that is temporarily configured by software to perform certain operations. For example, a hardware module can include software encompassed within a general-purpose processor or other programmable processor. It will be appreciated that the decision to implement a hardware module mechanically, in dedicated and permanently configured circuitry, or in temporarily configured circuitry (e.g., configured by software) can be driven by cost and time considerations.

Accordingly, the phrase "module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where a hardware module comprises a general-purpose processor configured by software to become a special-purpose processor, the general-purpose processor may be configured as respectively different special-purpose processors (e.g., comprising different hardware modules) at different times. Software can accordingly configure a particular processor or processors, for example, to constitute a particular hardware module at one instance of time and to constitute a different hardware module at a different instance of time.

Hardware modules can provide information to, and receive information from, other hardware modules. Accordingly, the described hardware modules can be regarded as being communicatively coupled. Where multiple hardware modules exist contemporaneously, communications can be achieved through signal transmission (e.g., over appropriate circuits and buses) between or among two or more of the hardware modules. In embodiments in which multiple hardware modules are configured or instantiated at different times, communications between or among such hardware modules may be achieved, for example, through the storage and retrieval of information in memory structures to which the multiple hardware modules have access. For example, one hardware module performs an operation and stores the output of that operation in a memory device to which it is communicatively coupled. A further hardware module can then, at a later time, access the memory device to retrieve and process the stored output. Hardware modules can also initiate communications with input or output devices, and can operate on a resource (e.g., a collection of information).

The various operations of example methods described herein can be performed, at least partially, by one or more processors that are temporarily configured (e.g., by software) or permanently configured to perform the relevant operations. Whether temporarily or permanently configured, such processors constitute processor-implemented modules that operate to perform one or more operations or functions described herein. As used herein, "processor-implemented module" refers to a hardware module implemented using one or more processors.

Similarly, the methods described herein can be at least partially processor-implemented, with a particular processor or processors being an example of hardware. For example, at least some of the operations of a method can be performed by one or more processors or processor-implemented modules. Moreover, the one or more processors may also operate to support performance of the relevant operations in a "cloud computing" environment or as a "software as a service" (SaaS). For example, at least some of the operations may be performed by a group of computers (as examples of machines 1000 including processors 1010), with these operations being accessible via a network (e.g., the Internet) and via one or more appropriate interfaces (e.g., an API). In certain embodiments, for example, a client device may relay or operate in communication with cloud computing systems, and may access circuit design information in a cloud environment.

The performance of certain of the operations may be distributed among the processors, not only residing within a single machine 1000, but deployed across a number of machines 1000. In some embodiments, the processors 1010 or processor-implemented modules are located in a single geographic location (e.g., within a home environment, an office environment, or a server farm). In some other embodiments, the processors or processor-implemented modules are distributed across a number of geographic locations.

Figure 10:
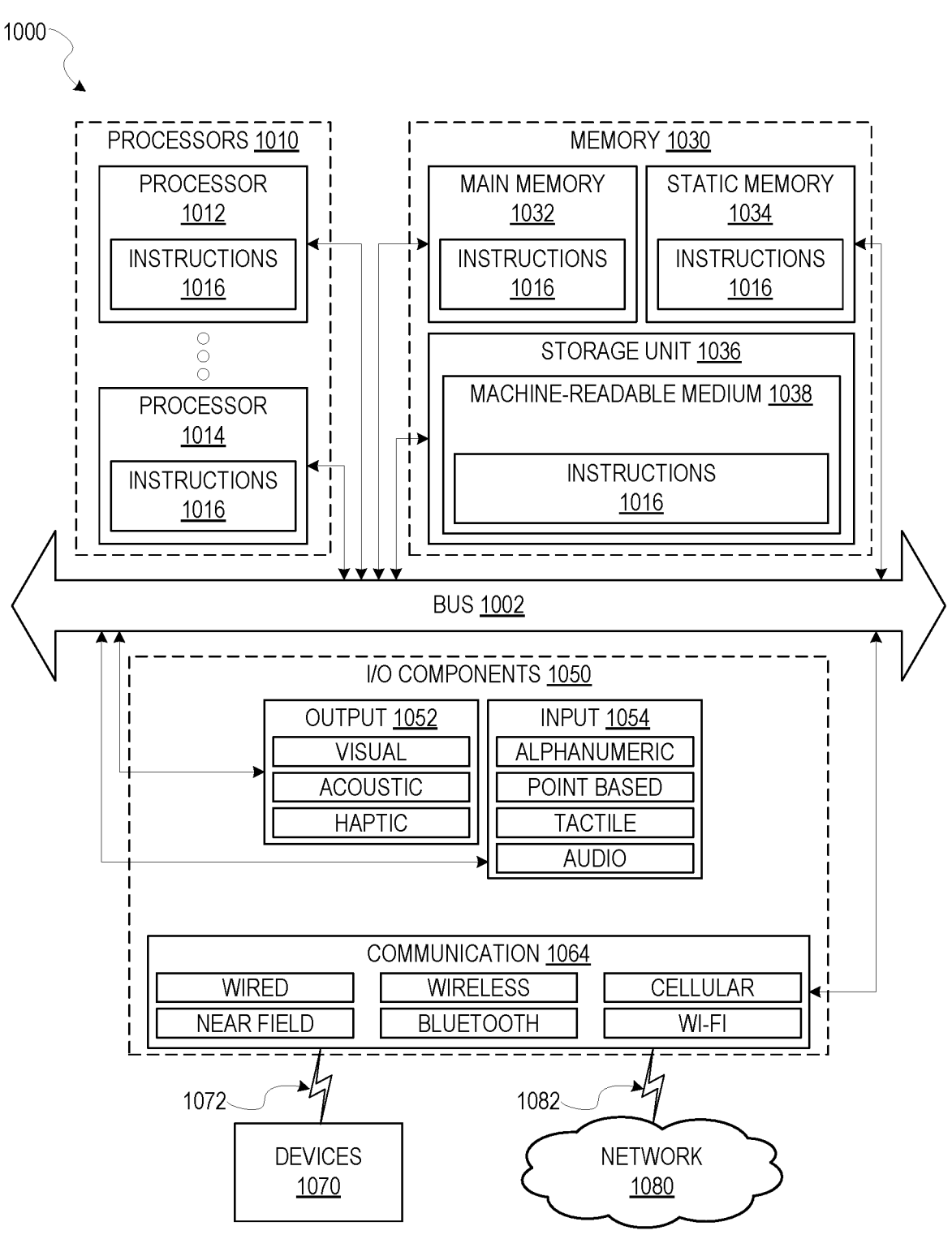
FIG. 10 is a diagram representing a machine in the form of a computer system within which a set of instructions are executed, causing the machine to perform any one or more of the methods discussed herein, according to some embodiments.

FIG. 10 is a diagrammatic representation of the machine 1000 in the form of a computer system within which a set of instructions may be executed for causing the machine 1000 to perform any one or more of the methodologies discussed herein, according to some embodiments. FIG. 10 shows components of the machine 1000, which is, according to some embodiments, able to read instructions from a machine-readable medium (e.g., a machine-readable storage medium) and perform any one or more of the methodologies discussed herein. Specifically, FIG. 10 shows a diagrammatic representation of the machine 1000 in the example form of a computer system, within which instructions 1016 (e.g., software, a program, an application, an applet, an app, or other executable code) for causing the machine 1000 to perform any one or more of the methodologies discussed herein can be executed. In alternative embodiments, the machine 1000 operates as a standalone device or can be coupled (e.g., networked) to other machines. In a networked deployment, the machine 1000 may operate in the capacity of a server machine or a client machine in a server-client network environment, or as a peer machine in a peer-to-peer (or distributed) network environment. The machine 1000 can comprise, but not be limited to, a server computer, a client computer, a personal computer (PC), a tablet computer, a laptop computer, a netbook, or any machine capable of executing the instructions 1016, sequentially or otherwise, that specify actions to be taken by the machine 1000. Further, while only a single machine 1000 is illustrated, the term "machine" shall also be taken to include a collection of machines 1000 that individually or jointly execute the instructions 1016 to perform any one or more of the methodologies discussed herein.

In various embodiments, the machine 1000 comprises processors 1010, memory 1030, and I/O components 1050, which can be configured to communicate with each other via a bus 1002. In some embodiments, the processors 1010 (e.g., a central processing unit (CPU), a reduced instruction set computing (RISC) processor, a complex instruction set computing (CISC) processor, a graphics processing unit (GPU), a digital signal processor (DSP), an ASIC, a radio-frequency integrated circuit (RFIC), another processor, or any suitable combination thereof) include, for example, a processor 1012 and a processor 1014 that may execute the instructions 1016. The term "processor" is intended to include multi-core processors 1010 that may comprise two or more independent processors 1012, 1014 (also referred to as "cores") that can execute the instructions 1016 contemporaneously. Although FIG. 10 shows multiple processors 1010, the machine 1000 may include a single processor 1012 with a single core, a single processor 1012 with multiple cores (e.g., a multi-core processor 1012), multiple processors 1010 with a single core, multiple processors 1010 with multiple cores, or any combination thereof.

The memory 1030 comprises a main memory 1032, a static memory 1034, and a storage unit 1036 accessible to the processors 1010 via the bus 1002, according to some embodiments. The storage unit 1036 can include a machine-readable medium 1038 on which are stored the instructions 1016 embodying any one or more of the methodologies or functions described herein. The instructions 1016 can also reside, completely or at least partially, within the main memory 1032, within the static memory 1034, within at least one of the processors 1010 (e.g., within the processor's cache memory), or any suitable combination thereof, during execution thereof by the machine 1000. Accordingly, in various embodiments, the main memory 1032, the static memory 1034, and the processors 1010 are considered machine-readable media 1038.

As used herein, the term "memory" refers to a machine-readable medium 1038 able to store data temporarily or permanently and may be taken to include, but not be limited to, random-access memory (RAM), read-only memory (ROM), buffer memory, flash memory, and cache memory. While the machine-readable medium 1038 is shown, in some embodiments, to be a single medium, the term "machine-readable medium" should be taken to include a single medium or multiple media (e.g., a centralized or distributed database, or associated caches and servers) able to store the instructions 1016. The term "machine-readable medium" shall also be taken to include any medium, or combination of multiple media, that is capable of storing instructions (e.g., the instructions 1016) for execution by a machine (e.g., the machine 1000), such that the instructions, when executed by one or more processors of the machine (e.g., the processors 1010), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more data repositories in the form of a solid-state memory (e.g., flash memory), an optical medium, a magnetic medium, other non-volatile memory (e.g., erasable programmable read-only memory (EPROM)), or any suitable combination thereof. The term "machine-readable medium" specifically excludes non-statutory signals per se.

The I/O components 1050 include a wide variety of components to receive input, provide output, produce output, transmit information, exchange information, capture measurements, and so on. In general, it will be appreciated that the I/O components 1050 can include many other components that are not shown in FIG. 10. The I/O components 1050 are grouped according to functionality merely for simplifying the following discussion, and the grouping is in no way limiting. In various embodiments, the I/O components 1050 include output components 1052 and input components 1054. The output components 1052 include visual components (e.g., a display such as a plasma display panel (PDP), a light emitting diode (LED) display, a liquid crystal display (LCD), a projector, or a cathode ray tube (CRT)), acoustic components (e.g., speakers), haptic components (e.g., a vibratory motor), other signal generators, and so forth. The input components 1054 include alphanumeric input components (e.g., a keyboard, a touch screen configured to receive alphanumeric input, a photo-optical keyboard, or other alphanumeric input components), pointbased input components (e.g., a mouse, a touchpad, a trackball, or other pointing instruments), tactile input components (e.g., a physical button, a touch screen that provides location and force of touches or touch gestures, or other tactile input components), audio input components (e.g., a microphone), and the like.

In some embodiments, outputs from an EDA computing device may include design documents, files for additional steps in a design flow, or outputs for circuit fabrication. As described herein, "constraints," "requirements," "design elements," and other aspects of a circuit design refer to selectable values that are set as part of the design of a circuit. Such design constraints, requirements, or elements may be adjusted by a system operator or circuit designer to suit the particular goals of a project or circuit that results from the operations described herein.

Communication can be implemented using a wide variety of technologies. The I/O components 1050 may include communication components 1064 operable to couple the machine 1000 to a network 1080 or devices 1070 via a coupling 1082 and a coupling 1072, respectively. For example, the communication components 1064 include a network interface component or another suitable device to interface with the network 1080. In further examples, the communication components 1064 include wired communication components, wireless communication components, cellular communication components, near field communication (NFC) components, BLUETOOTH® components (e.g., BLUETOOTH® Low Energy), WI-FI® components, and other communication components to provide communication via other modalities. The devices 1070 may be another machine or any of a wide variety of peripheral devices (e.g., a peripheral device coupled via a USB).

In various embodiments, one or more portions of the network 1080 can be an ad hoc network, an intranet, an extranet, a virtual private network (VPN), a local area network (LAN), a wireless LAN (WLAN), a wide area network (WAN), a wireless WAN (WWAN), a metropolitan area network (MAN), the Internet, a portion of the Internet, a portion of the public switched telephone network (PSTN), a plain old telephone service (POTS) network, a cellular telephone network, a wireless network, a WI-FI® network, another type of network, or a combination of two or more such networks. For example, the network 1080 or a portion of the network 1080 may include a wireless or cellular network, and the coupling 1082 may be a Code Division Multiple Access (CDMA) connection, a Global System for Mobile communications (GSM) connection, or another type of cellular or wireless coupling.

Furthermore, the machine-readable medium 1038 is non-transitory (in other words, not having any transitory signals) in that it does not embody a propagating signal. However, labeling the machine-readable medium 1038 "non-transitory" should not be construed to mean that the machine-readable medium 1038 is incapable of movement; the machine-readable medium 1038 should be considered as being transportable from one physical location to another. Additionally, since the machine-readable medium 1038 is tangible, the machine-readable medium 1038 may be considered to be a machine-readable device.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to some embodiments, various modifications and changes may be made to these embodiments without departing from the broader scope of embodiments of the present disclosure.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The detailed description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. The terms "a" or "an" should be read as meaning "at least one," "one or more," or the like. The use of words and phrases such as "one or more," "at least," "but not limited to," or other like phrases shall not be read to mean that the narrower case is intended or required in instances where such broadening phrases may be absent.

Boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The description above includes systems, methods, devices, instructions, and computer media (e.g., computing machine program products) that embody illustrative embodiments of the disclosure. In the description, for the purposes of explanation, numerous specific details are set forth in order to provide an understanding of various embodiments of the inventive subject matter. It will be evident, however, to those skilled in the art, that embodiments of the inventive subject matter may be practiced without these specific details. In general, well-known instruction instances, protocols, structures, and techniques are not necessarily shown in detail.

What is claimed is:

1. A non-transitory computer-readable medium comprising instructions that, when executed by a hardware processor of a device, cause the device to perform operations comprising:

accessing circuit data that describes a set of layers of a circuit design, a set of pins of the circuit design, and a set of wire information for the set of layers;

generating a set of layer pin count values for the set of layers by determining a layer pin count value for each individual layer of the set of layers based on the circuit data;

generating a set of classifications for the set of layers by classifying each individual layer of the set of layers based on an individual layer pin count value in the set of layer pin count values corresponding to the individual layer and an individual wire information in the set of wire information corresponding to the individual layer;

generating a set of grid cell pin count values for a plurality of grid cells of the set of layers by determining a grid cell pin count value for each grid cell of the plurality of grid cells based on the circuit data; and for a select layer of the set of layers:

determining whether the select layer satisfies a layer classification criterion based on a select classification in the set of classifications corresponding to the select layer; and in response to determining that the select layer satisfies the layer classification criterion:

determining, from the plurality of grid cells, a subset of grid cells of the select layer that each satisfy a grid cell adjustment criterion; and adjusting a routing capacity of a select grid cell in the subset of grid cells, the adjusting of the routing capacity of the select grid cell comprising:

determining a pin density penalty value for the select grid cell based on at least one of a capacity per track of the select grid cell, a layer density factor associated with the select grid cell, or an individual grid cell pin count value in the set of grid cell pin count values that corresponds to the select grid cell; and applying the pin density penalty value to the routing capacity of the select grid cell.

2. The non-transitory computer-readable medium of claim 1, wherein the determining of the layer pin count value for each individual layer of the set of layers based on the circuit data comprises:

initializing the set of layer pin count values; and for each individual pin in the set of pins:

determining to which single layer, in the set of layers, the individual pin belongs; and incrementing a single layer pin count value in the set of layer pin count values corresponding to the single layer.

3. The non-transitory computer-readable medium of claim 1, wherein the classifying of each individual layer of the set of layers is performed from a bottom layer to a top layer of the set of layers.

4. The non-transitory computer-readable medium of claim 1, wherein the classifying of each individual layer of the set of layers based on the individual layer pin count value in the set of layer pin count values corresponding to the individual layer and the individual wire information in the set of wire information corresponding to the individual layer comprises:

classifying the individual layer with an ignore classification in response to the individual layer pin count value indicating that the individual layer has no pins.

5. The non-transitory computer-readable medium of claim 1, wherein the classifying of each individual layer of the set of layers based on the individual layer pin count value in the set of layer pin count values corresponding to the individual layer and the individual wire information in the set of wire information corresponding to the individual layer comprises:

classifying the individual layer with a pin layer classification in response to the individual layer pin count value surpassing a pin threshold value.

6. The non-transitory computer-readable medium of claim 5, wherein the pin threshold value is determined based on a predetermined ratio and a total number of pins in the set of pins of the circuit design.

7. The non-transitory computer-readable medium of claim 1, wherein the classifying of each individual layer of the set of layers based on the individual layer pin count value in the set of layer pin count values corresponding to the individual layer and the individual wire information in the set of wire information corresponding to the individual layer comprises:

classifying the individual layer with a pin access layer classification in response to the individual layer being disposed right above a lower layer in the set of layers having a pin layer classification.

8. The non-transitory computer-readable medium of claim 1, wherein the classifying of each individual layer of the set of layers based on the individual layer pin count value in the set of layer pin count values corresponding to the individual layer and the individual wire information in the set of wire information corresponding to the individual layer comprises:

classifying the individual layer with a pin access layer classification in response to the individual layer being disposed within a range of layers above a lower layer in the set of layers having a pin layer classification.

9. The non-transitory computer-readable medium of claim 1, wherein the classifying of each individual layer of the set of layers based on the individual layer pin count value in the set of layer pin count values corresponding to the individual layer and the individual wire information in the set of wire information corresponding to the individual layer comprises:

classifying the individual layer with an other-type layer classification in response to the individual layer being disposed above a lower layer in the set of layers having a pin access layer classification.

10. The non-transitory computer-readable medium of claim 1, wherein the classifying of each individual layer of the set of layers based on the individual layer pin count value in the set of layer pin count values corresponding to the individual layer and the individual wire information in the set of wire information corresponding to the individual layer comprises:

classifying the individual layer with a pin access layer classification in response to the individual wire information of the individual layer satisfying a pin access layer criterion.

11. The non-transitory computer-readable medium of claim 10, wherein the pin access layer criterion is satisfied if a calculated ratio associated with the individual layer surpasses a predetermined threshold value, the calculated ratio comprising a ratio of the individual wire information of the individual layer and a single wire information of a lower layer in the set of layers that is right below the individual layer, the predetermined threshold value comprising a predetermined ratio.

12. The non-transitory computer-readable medium of claim 1, wherein the determining of the grid cell pin count value for each grid cell of the plurality of grid cells comprises:

initializing the set of grid cell pin count values; and
for each individual pin in the set of pins:
determining to which individual grid cell, in the plurality of grid cells, the individual pin belongs; and
incrementing an individual grid cell pin count value in the set of grid cell pin count values corresponding to the individual grid cell.

13. The non-transitory computer-readable medium of claim 1, wherein the grid cell adjustment criterion is satisfied by an individual grid cell if an individual grid cell pin count value of the individual grid cell surpasses a predetermined threshold value.

14. The non-transitory computer-readable medium of claim 1, wherein the layer classification criterion is satisfied by the select layer if the select classification comprises a pin layer classification.

15. The non-transitory computer-readable medium of claim 1, wherein the layer classification criterion is satisfied by the select layer if the select classification comprises a pin access layer classification.

16. The non-transitory computer-readable medium of claim 1, wherein the layer classification criterion is satisfied by the select layer if the select classification comprises a marked-by-user layer classification.

17. The non-transitory computer-readable medium of claim 1, wherein the applying of the pin density penalty value to the routing capacity of the select grid cell comprises:

decreasing the routing capacity of the select grid cell by the pin density penalty value while maintaining a minimum routing capacity per track (CPT).

18. A method comprising:
accessing, by a hardware processor, circuit data that describes a set of layers of a circuit design, a set of pins of the circuit design, and a set of wire information for the set of layers;
generating, by the hardware processor, a set of layer pin count values for the set of layers based on the circuit data;
generating, by the hardware processor, a set of classifications for the set of layers based on the set of layer pin count values and the set of wire information;
generating, by the hardware processor, a set of grid cell pin count values for a plurality of grid cells of the set of layers based on the circuit data; and
adjusting a routing capacity of a select grid cell in the plurality of grid cells, the adjusting of the routing capacity of the select grid cell comprising:
determining a pin density penalty value for the select grid cell based on at least one of a capacity per track of the select grid cell, a layer density factor associated with the select grid cell, or an individual grid cell pin count value in the set of grid cell pin count values that corresponds to the select grid cell; and
applying the pin density penalty value to the routing capacity of the select grid cell.

19. The method of claim 18, wherein the generating of the set of grid cell pin count values for the plurality of grid cells of the set of layers based on the circuit data comprises:

initializing the set of grid cell pin count values; and
for each individual pin in the set of pins:
determining to which individual grid cell, in the plurality of grid cells, the individual pin belongs; and
incrementing an individual grid cell pin count value in the set of grid cell pin count values corresponding to the individual grid cell.

20. A device comprising:

a memory storing instructions; and a hardware processor communicatively coupled to the memory and configured by the instructions to perform operations comprising:

generating a set of layer pin count values for a set of layers based on circuit data, the circuit data describing the set of layers of a circuit design, a set of pins of the circuit design, and a set of wire information for the set of layers;

generating a set of classifications for the set of layers based on the set of layer pin count values and the set of wire information;

generating a set of grid cell pin count values for a plurality of grid cells of the set of layers based on the circuit data; and adjusting a routing capacity of a select grid cell in the plurality of grid cells, the adjusting of the routing capacity of the select grid cell comprising:

determining a pin density penalty value for the select grid cell based on at least one of a capacity per track of the select grid cell, a layer density factor associated with the select grid cell, or an individual grid cell pin count value in the set of grid cell pin count values that corresponds to the select grid cell; and applying the pin density penalty value to the routing capacity of the select grid cell.

\* \* \* \* \*